United States Patent
Kim

(10) Patent No.: US 7,689,184 B2
(45) Date of Patent: Mar. 30, 2010

(54) METHOD OF TUNING FREQUENCY AND APPARATUS THEREFOR

(75) Inventor: Jae Eung Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 671 days.

(21) Appl. No.: 11/282,795

(22) Filed: Nov. 17, 2005

(65) Prior Publication Data

US 2006/0105727 A1    May 18, 2006

(30) Foreign Application Priority Data

Nov. 17, 2004    (KR)    ............. 10-2004-0093984

(51) Int. Cl.
*H04B 1/16* (2006.01)
(52) U.S. Cl. .............. 455/154.1; 455/161.2; 455/185.1
(58) Field of Classification Search .............. 455/179.1, 455/180.1, 184.1, 185.1, 260, 264, 3.01, 455/3.06, 154.1, 161.1, 161.2, 186.1; 348/731, 348/732, 735; 375/375, 376
See application file for complete search history.

(56) References Cited

U.S. PATENT DOCUMENTS 5,787,135 A * 7/1998 Clark .................... 375/376
6,928,262 B1 * 8/2005 Kanemitsu ............. 455/3.06
7,375,771 B2 * 5/2008 Naoi et al. .............. 348/732
2004/0117855 A1  6/2004 Nakamura

FOREIGN PATENT DOCUMENTS

| CN | 1409569 | 1/2006 |
|---|---|---|
| KR | 1020000067325 A | 11/2000 |
| KR | 20010068681 A | 7/2001 |

* cited by examiner

*Primary Examiner*—Thanh C Le
(74) *Attorney, Agent, or Firm*—Lee, Hong, Degerman, Kang & Waimey

(57) ABSTRACT

A method of tuning a frequency and apparatus thereof are disclosed, in which broadcast channel information for bringing up the image of broadcasting is used and by which the frequency corresponding to the broadcast channel information is automatically tuned. The present invention includes the steps of storing a broadcast channel information and a frequency for a specific broadcasting, searching the frequency using the broadcast channel information provided by a user, and tuning the searched frequency.

13 Claims, 8 Drawing Sheets

METHOD OF TUNING FREQUENCY AND APPARATUS THEREFOR

CROSS REFERENCE TO RELATED APPLICATION

This application claims the benefit of the Korean Patent Application No. 10-2004-0093984, filed on Nov. 17, 2004, which is hereby incorporated by reference as if fully set forth herein.

BACKGROUND OF THE INVENTION

1. Field of the Invention

The present invention relates to communications, and more particularly, to a method of tuning a frequency and apparatus thereof. Although the present invention is suitable for a wide scope of applications, it is particularly suitable for a communications device.

2. Discussion of the Related Art

Generally, an analog frequency tuning device employs an inductor or capacitor system.

FIG. 1A and FIG. 1B are circuit diagrams of analog tuning devices according to a related art, respectively.

Referring to FIG. 1A, a variable-inductor analog frequency tuning device is shown.

Referring to FIG. 1B, a variable-capacitor analog frequency tuning device is shown.

In the above-explained two kinds of systems, a user performs tuning by directly manipulating an external adjustment button for adjusting a variable inductor L or a variable capacitor C.

To tune a frequency of another channel after tuning a frequency corresponding to one channel using an external adjustment button, a user needs to adjust frequencies using the external adjustment button again.

In case that there are a plurality of channels to be used by a user, the external adjustment button needs to be manipulated each time a frequency corresponding to each of the channels is changed.

And, it is difficult for a user to remember the frequencies corresponding to a plurality of the channels, respectively.

Moreover, a user needs to finely manipulate the adjustment button for frequency tuning.

FIG. 2 is a block diagram of a digital frequency tuning device according to a related art.

Referring to FIG. 2, a digital frequency tuning device according to a related art consists of a reference frequency oscillator 1, a voltage controlled oscillator (VCO) 2, a divider 3, a phase detector 4 and a pulse voltage converter 5.

The reference frequency oscillator 1 outputs a reference frequency.

The voltage controlled oscillator (VCO) 2 adjusts to output an oscillation frequency according to an input voltage.

The divider 3 divides an output (oscillation frequency) of the voltage controlled oscillator 2 by a predetermined ratio.

The phase detector 4 compares an output of the reference frequency oscillator 1 to an output of the divider 3 and then outputs a corresponding difference between the two outputs.

The pulse voltage converter 5 converts an output of the phase detector 4 to a voltage and then outputs the voltage to the voltage controlled oscillator 2.

In case of using the related art digital frequency tuning device, a user presses a frequency setting number button to input a specific frequency in direct.

Besides, the user inputs to designate the specific frequency and makes the designated frequency correspond to several numbers to store in a memory. Thereafter, if a button of a predetermined number is pressed, the frequency corresponding to the pressed number is tuned. Hence, a frequently usable frequency can be simply tuned by pressing the corresponding number button.

Yet, since it is difficult to memorize the entire frequencies corresponding to the numbers, respectively, each number button needs to be pressed one by one to find a specific frequency. For instance, a frequency corresponding to a button No. 5 is stored as 95.9 MHz and a current device is set to a frequency corresponding to a button No. 1. If a user is unable to remember that the button No. 5 is set to 95.9 MHz, it is highly probable that the user tries to press other buttons No. 2, No. 3, No. 4 and the like. Finally, the user can find 95.9 MHz of No. 5 after having tries various different number buttons.

Thus, in the related art device using the analog or digital frequency tuning, it is difficult to perform the frequency tuning.

SUMMARY OF THE INVENTION

Accordingly, the present invention is directed to a method of tuning a frequency and apparatus thereof that substantially obviate one or more problems due to limitations and disadvantages of the related art.

An object of the present invention is to provide a method of tuning a frequency and apparatus thereof, in which broadcast channel information for bringing up the image of broadcasting is used and by which the frequency corresponding to the broadcast channel information is automatically tuned.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of tuning a frequency according to the present invention includes the steps of storing a broadcast channel information and a frequency for a specific broadcasting, searching the frequency using the broadcast channel information provided by a user, and tuning the searched frequency.

Preferably, the broadcast channel information includes a plurality of informations to identify the broadcasting.

More preferably, the broadcast channel information includes at least one of a broadcasting station name, a broadcasting program title, an anchor and a channel number.

Preferably, the searched frequency is converted to a binary-bit value and the tuning step is carried out using the binary-bit value.

Preferably, in the storing step, the broadcast channel information and the frequency are represented.

In another aspect of the present invention, an apparatus for tuning a frequency includes a first means for at least one input of a broadcast channel information and the frequency for a specific broadcasting, a second means for storing the broadcast channel information and the frequency inputted by the first means to be linked with each other, and a third means for searching the second means for the frequency using the broadcast channel information inputted by the first means, the third means for tuning the searched frequency.

Preferably, the apparatus is provided to a communication device.

Preferably, the third means converts the searched to a binary-bit value to tune the frequency using the binary-bit value.

More preferably, the third means includes an oscillator outputting a reference frequency, a voltage controlled oscillator adjusting to output an oscillation frequency according to an input voltage, a divider dividing an output of the voltage controlled oscillator using the binary-bit value, a phase detector comparing outputs of the oscillator and the divider together to output a corresponding difference between the compared outputs, and a pulse voltage converter converting an output of the phase detector to a voltage to output to the voltage controlled oscillator.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1A:
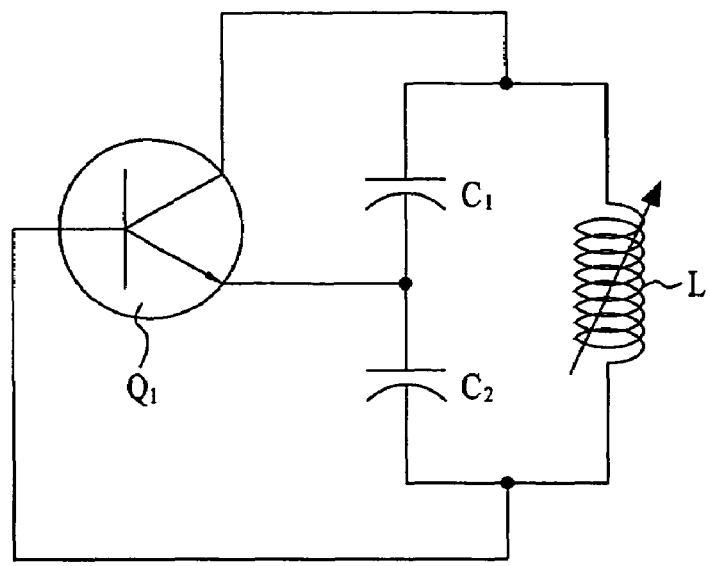
FIG. 1A and FIG. 1B are circuit diagrams of analog tuning devices according to a related art, respectively.
Figure 1B:
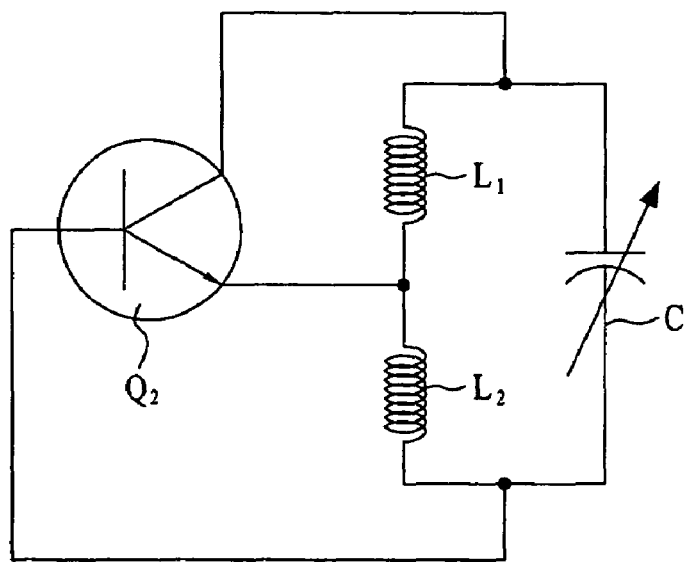
Figure 2:
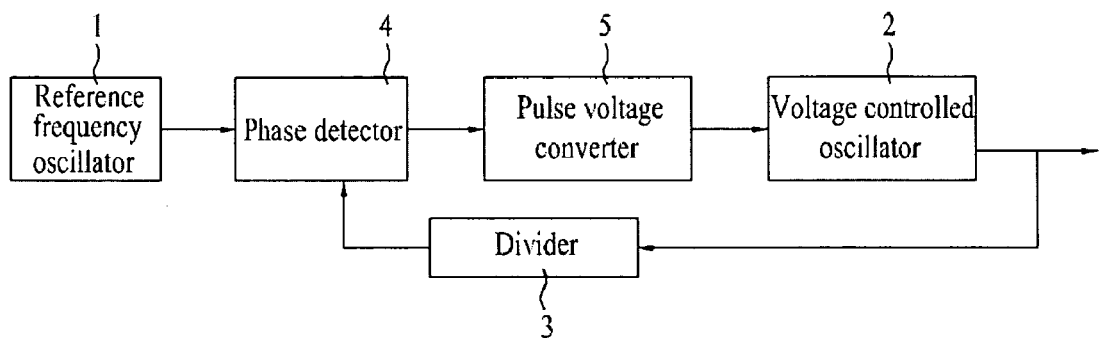
FIG. 2 is a block diagram of a digital frequency tuning device according to a related art.

Reference will now be made in detail to the preferred embodiments of the present invention, examples of which are illustrated in the accompanying drawings. Wherever possible, the same reference numbers will be used throughout the drawings to refer to the same or like parts.

First of all, a method of tuning a frequency and apparatus thereof according to the present invention are preferably applicable to a communications device. Preferably, the communications device is a mobile communication terminal. Hereinafter, an example of applying the present invention to the communications device is mainly explained.

In the present invention, a broadcasting program, a channel defined by the broadcasting program and a frequency corresponding to the defined channel are defined.

The broadcasting program is identified by a broadcasting station name, a program title, an anchor or the like and is always unique.

The channel is identified by a numeral, a sign and the like and can be changed according to a location to correspond to the channel. Yet, in the following description, it is assumed that the frequency is unique.

Therefore, it is defined that elements configuring one broadcast include the broadcasting program, the channel number and the frequency. An example of the broadcasting configuration is shown in Table 1.

TABLE 1

| Broadcasting Program | | | | |
|---|---|---|---|---|
| Broadcasting station name | Program title | Anchor | Channel No. | Frequency |
| KBS | TOP 10 | Hong Gil-Dong | 10 | 899 kHz |
| MBC | POP MUSIC BEST | Mr. So-and-so | 13 | 91.9 MHz |

In a terminal according to the present invention, the broadcast is identified by the above-explained elements. And, the broadcasting frequency is set using at least one of the elements.

An example of setting a broadcasting frequency through a broadcasting frequency setting menu is summarized as follows.

1. An input environment of broadcast channel information (broadcasting station name, program title, anchor, channel No., etc.) corresponding to the broadcasting elements shown in Table 1 is provided. Simultaneously, an environment for inputting a frequency of the broadcasting program is provided.

2. At least one inputted broadcast channel information and frequency are stored. And, such a fact is represented. Of course, if the frequency is inputted, a process of verifying whether the inputted frequency is valid can be further carried out. Such a verifying process will be explained in detail later.

Another example of setting a broadcasting frequency through a broadcasting frequency setting menu is summarized as follows.

1. A frequency corresponding to a random broadcasting program is tuned. And, the tuned frequency is represented as a numeral and symbol.

2. An input environment of broadcast channel information (broadcasting station name, program title, anchor, channel No., etc.) for the tuned frequency is provided. In this case, the broadcast channel information corresponds to the elements shown in Table 1.

3. At least one inputted broadcast channel information and tuned frequency are stored. And, such a fact is represented.

Meanwhile, the terminal according to the present invention tunes broadcast frequencies using at least one of the broadcast elements. For this, the terminal is provided with a menu for broadcast frequency tuning.

An example of tuning a broadcast frequency using broadcast channel information provided by a user through the broadcast frequency tuning menu is explained as follows.

1. An input environment of broadcast channel information (broadcasting station name, program title, anchor, channel No., etc.) is provided. A user then inputs a phrase that brings up the image of a user-specific broadcast, which is shown in FIG. 7E.

2. It is searched whether data matching the inputted broadcast channel information exists.

3. If the inputted broadcast channel information exists, the corresponding broadcast channel information is represented.

Simultaneously, a frequency corresponding to the broadcast channel information is represented as a numeral and symbol. Simultaneously, tuning for the frequency corresponding to the broadcast channel information is carried out.

Figure 3:
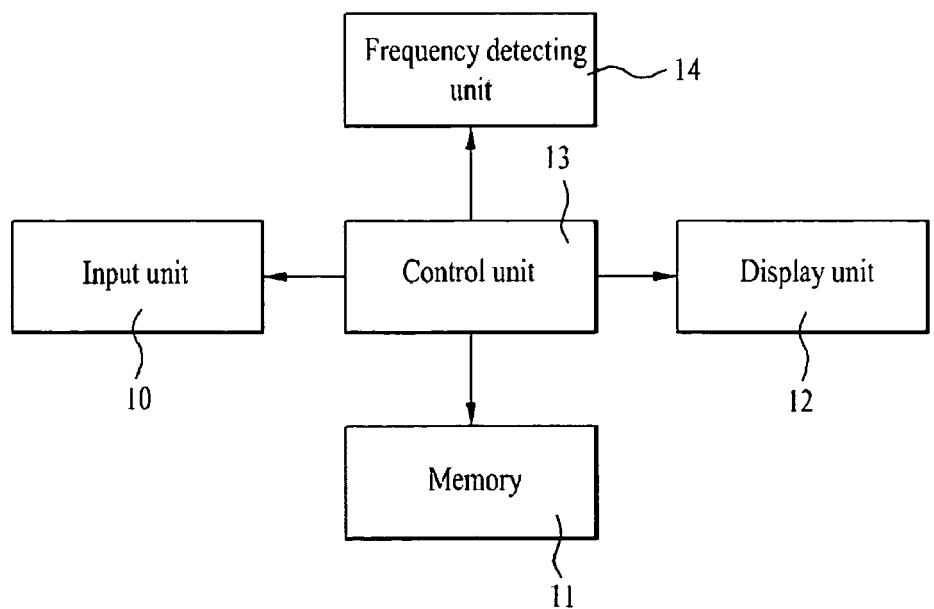
FIG. 3 is a block diagram of a terminal for frequency tuning according to one embodiment of the present invention.

FIG. 3 is a block diagram of a terminal for frequency tuning according to one embodiment of the present invention.

Referring to FIG. 3, a frequency tuning apparatus according to the present invention is provided to a communication device. Hence, elements of the frequency tuning apparatus explained in the following coincide with internal elements of the communication device in part. For instance, an input unit 10, a memory 11 and a display unit 12 explained in the following description are the elements of the communication device.

Meanwhile, a frequency tuning apparatus according to the present invention includes an input unit 10, a memory 11, a display unit 12, a control unit and a frequency detecting unit 14.

The input unit 10 includes a plurality of keys for inputting characters (Korean, English), numerals and special characters. The input unit 10 is a means manipulated by a user for selecting menus (broadcast frequency setting menu, broadcast frequency tuning menu, etc.) provided to the terminal or inputting broadcast channel information and frequency. In this case, the broadcast channel information is the elements configuring a broadcast and includes titles for identifying broadcasting programs or channel numbers for identifying channels and the like. Meanwhile, the input unit 10 is the means used by a user for inputting user-specific broadcast channel information such as a microphone, a touch pad and the like as well as a plurality of the keys.

The memory 11 stores the broadcast channel information and/or frequency inputted via the input unit 10. In particular, the memory 11 stores the broadcast channel information linked with the corresponding frequency according to a control of the control unit 13.

The display unit 12 represents execution processes of the menus (broadcast frequency setting menu, broadcast frequency tuning menu, etc.) provided to the terminal and a process of inputting the broadcast channel information and frequency.

In brief, the input and display units 10 and 12 are the means for exchanging information between the user and the terminal.

The control unit 13 executes the broadcast frequency setting menu. The control unit 13 controls the memory 11 to store the broadcast channel information and frequency inputted when the broadcast frequency setting menu is executed. The control menu 13 executes the broadcast frequency tuning menu. If the broadcast channel information is inputted when the broadcast frequency tuning menu is executed, the control unit 13 searches the memory 11 for the information coinciding with the inputted information and the information (frequency) linked with the inputted information. The control unit 13 then converts the frequency searched from the memory 11 to a binary-bit value.

If the binary-bit value converted by the control unit 13 is inputted, the frequency detecting unit 14 tunes the frequency corresponding to the binary-bit value.

Figure 4:
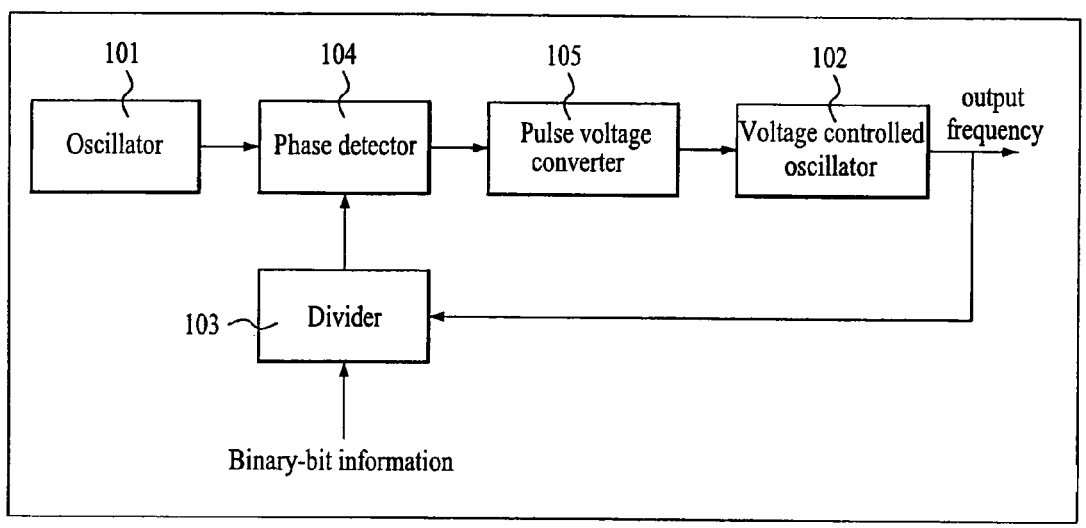
FIG. 4 is a block diagram of an apparatus for frequency tuning according to one embodiment of the present invention.

FIG. 4 is a block diagram of an apparatus for frequency tuning according to one embodiment of the present invention.

Referring to FIG. 4, an apparatus for frequency tuning according to one embodiment of the present invention includes an oscillator 101, a voltage controlled oscillator (VCO) 102, a divider 103, a phase detector 104 and a pulse voltage converter 105.

The oscillator 101 outputs a reference frequency and preferably includes a quartz oscillator.

The voltage controlled oscillator (VCO) 102 adjusts to output an oscillation frequency according to an input voltage.

The divider 103 divides an output (oscillation frequency) of the voltage controlled oscillator 102 by the binary-bit value outputted from the control unit 13 shown in FIG. 3.

The phase detector 104 compares an output (reference frequency) of the oscillator 011 to an output of the divider 103 and then outputs a corresponding difference between the two outputs.

The pulse voltage converter 105 converts an output of the phase detector 104 to a voltage and then outputs the voltage to the voltage controlled oscillator 102.

In case of using the frequency tuning apparatus according to the present invention, if a user inputs broadcast channel information via the broadcast frequency tuning menu, the control unit 13 searches the memory 11 for the stored frequency linked to the inputted broadcast channel information. The control unit 13 converts the searched frequency to the binary-bit value and then sends the binary-bit value to the frequency tuning apparatus. The frequency tuning apparatus then automatically tunes the corresponding frequency using the inputted binary-bit value.

Meanwhile, the frequency tuning apparatus shown in FIG. 4 preferably includes the frequency detecting unit 14 shown in FIG. 3.

Figure 5:
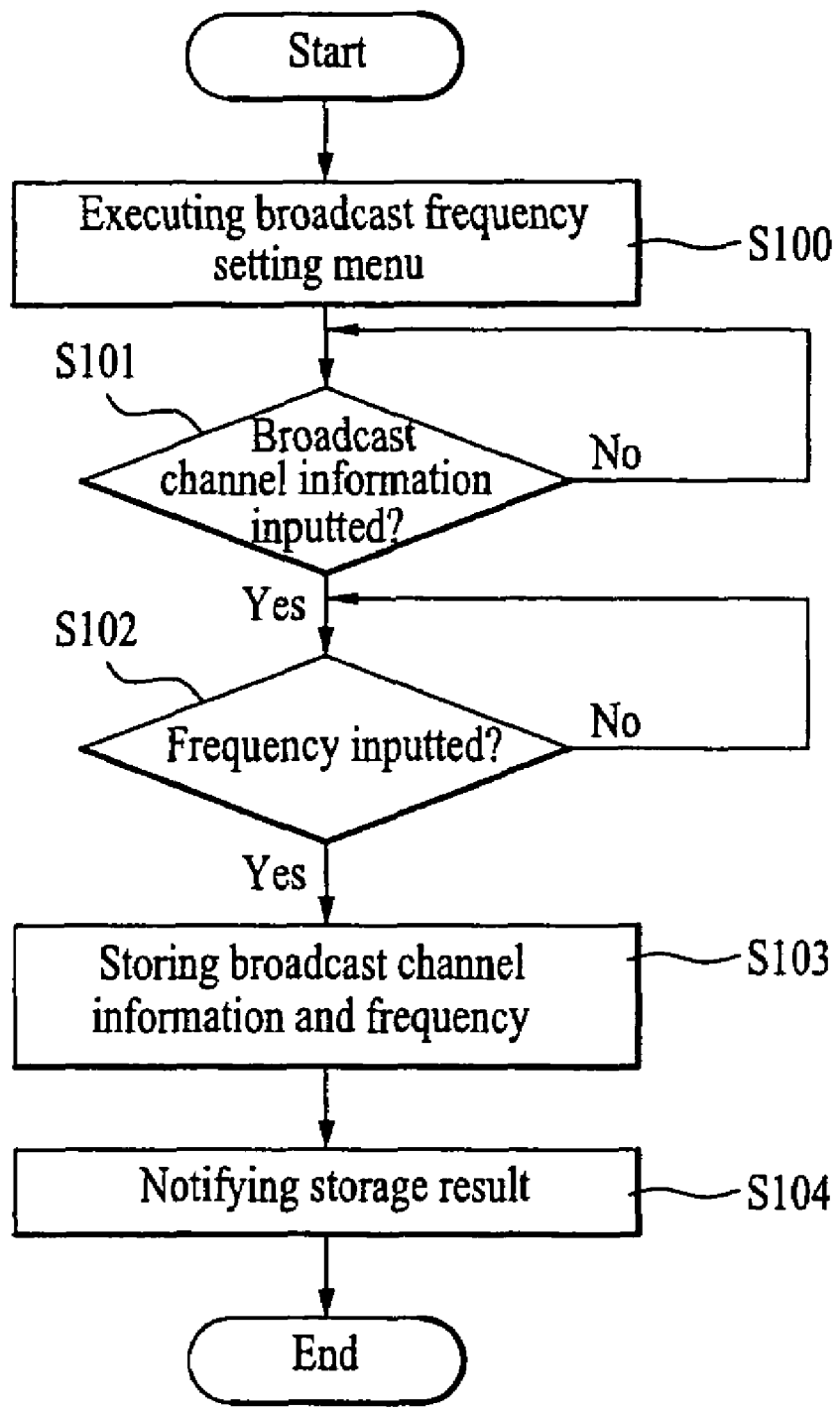
FIG. 5 is a flowchart of a broadcast channel setting procedure for frequency tuning according to one embodiment of the present invention.

FIG. 5 is a flowchart of a broadcast channel setting procedure for frequency tuning according to one embodiment of the present invention.

Figure 7A:
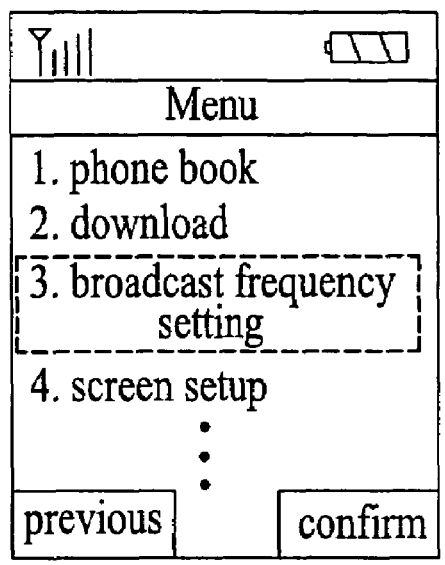
FIGS. 7A to 7F are diagrams for explaining examples of a frequency tuning procedure in a terminal according to the present invention.

Referring to FIG. 5, a menu list having a plurality of menus, as shown in FIG. 7A, is represented.

Figure 7B:
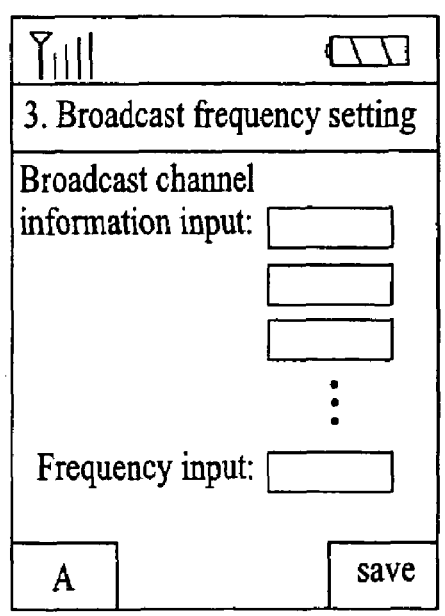

If a broadcast frequency setting menu for broadcast channel setting is selected, the selected broadcast frequency setting menu is executed (S100). So, a means, as shown in FIG. 7B, for inputting broadcast channel information (broadcast station name, program title, anchor, channel No., etc.) corresponding to broadcasting elements or a frequency of a broadcasting program is represented.

Figure 7C:
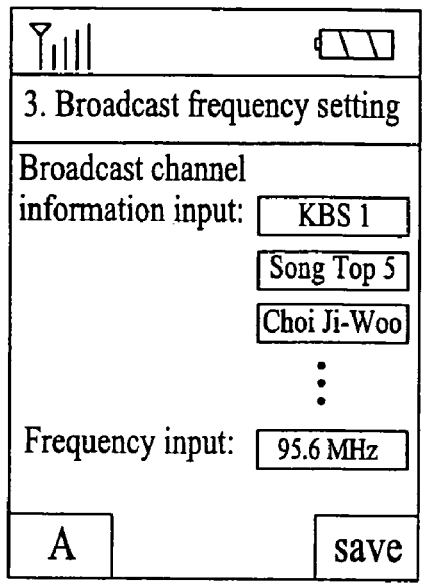

If at least one broadcast channel information is inputted to the represented means and if the frequency linked with the broadcast channel information is inputted (S101, S102), as shown in FIG. 7C, the inputted information and frequency are linked with each other to be stored (S103).

Figure 7D:
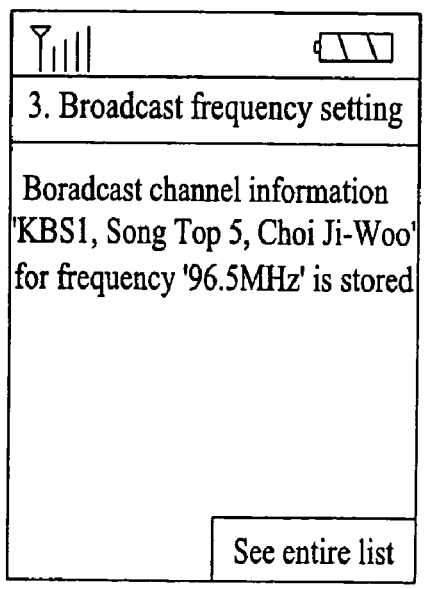
Figure 7E:
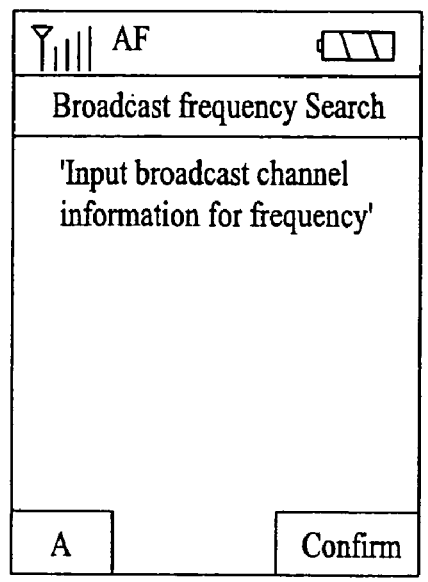

In storing them, the terminal displays on a display means the fact that the broadcast channel information and frequency are being stored. Hence, a user can be notified of the displayed fact (S104). FIG. 7D shows an example of such a notification.

For additional example, if the frequency linked with the broadcast channel information is inputted, the terminal verifies whether the inputted frequency is valid o not. The verification is to check whether a signal of the corresponding frequency is correctly caught in a manner of carrying out the frequency tuning via the frequency tuning apparatus shown in FIG. 4.

If the inputted frequency is decided as an invalid frequency, the terminal represents a message requesting reconfirmation and reentry of a frequency to a user on the display means.

For another instance, after the broadcast frequency setting menu has been executed, a frequency corresponding to a random broadcasting programs and the tuned frequency is represented as a numeral and symbol. Subsequently, a means for inputting the broadcast channel information (broadcasting station name, program title, anchor, channel No., etc.) corresponding to the elements of the broadcasting is represented. And, a part for inputting a frequency in FIG. 7B is removed from the means. If at least one broadcast channel information is inputted to the represented means, the previously tuned frequency and the inputted broadcast channel information are linked with each other to be stored.

Figure 6:
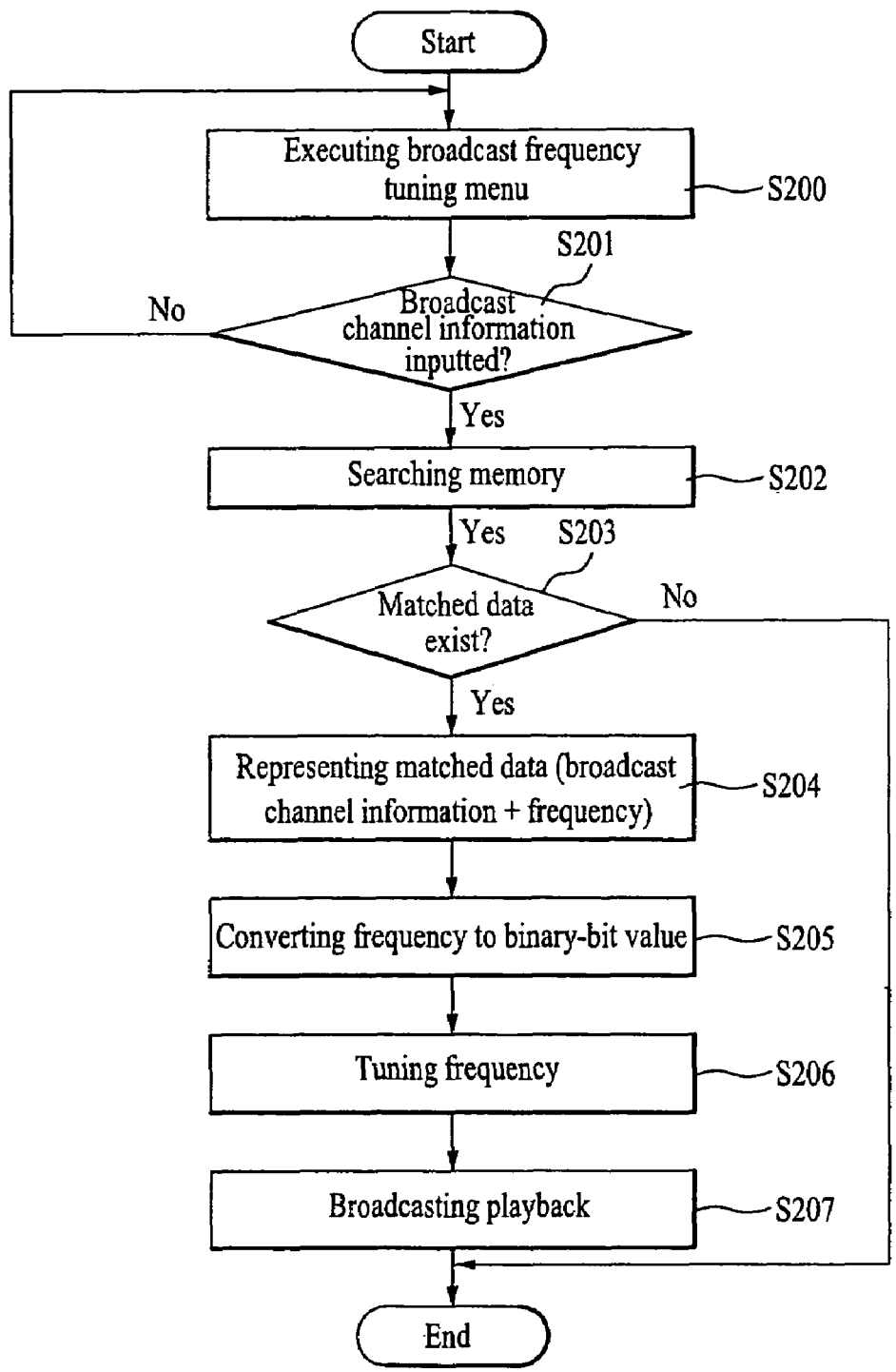
FIG. 6 is a flowchart of a frequency tuning procedure according to one embodiment of the present invention.

FIG. 6 is a flowchart of a frequency tuning procedure according to one embodiment of the present invention, in which a process of searching a memory for broadcast channel information and frequency for frequency tuning and a process of performing frequency tuning automatically using the searched result are shown.

Referring to FIG. 6, if a broadcast frequency tuning menu for searching and tuning a broadcast frequency is selected from various menus provided to a terminal, the selected broadcast frequency tuning menu is executed (S200).

A means for inputting the broadcast channel information (broadcasting station name, program title, anchor, channel No., etc.) corresponding to the elements of the broadcasting is represented.

If broadcast channel information, as shown in FIG. 7D, is inputted to the represented means (S201), a memory is searched for data matching the inputted broadcast channel information (S202).

If the data matching the inputted broadcast channel information exists (S203), the broadcast channel information is represented. Simultaneously, a frequency corresponding to the broadcast channel information is represented as a numeral and symbol (S204).

Simultaneously, the control unit converts the corresponding frequency to a binary-bit value (S205).

The control unit provides the converted binary-bit value to the frequency tuning apparatus. And, the frequency tuning apparatus, as mentioned in FIG. 4, tunes the frequency corresponding to the binary-bit value using the inputted binary-bit value (S206).

Hence, even if the user just inputs the broadcast channel information, the frequency found from the broadcast channel information is automatically tuned.

Figure 7F:
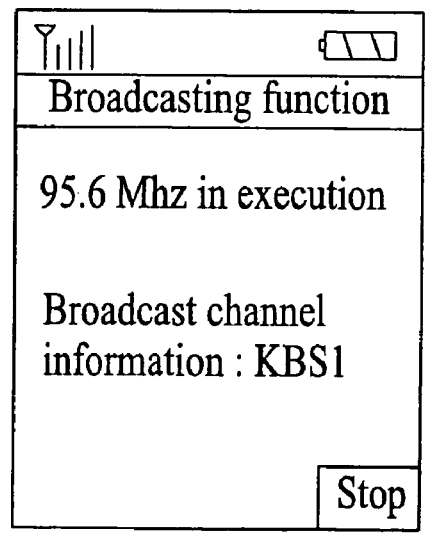

Finally, the terminal plays back the broadcasting of the tuned frequency (S207). In case of radio broadcasting, at least one of broadcast channel information and frequency of the currently-played radio broadcasting, as shown in FIG. 7F, is represented via the display means.

Meanwhile, in the above description, the meaning of 'represent' is to display something on the display means or to output something into sound.

Accordingly, the present invention provides the following effects or advantages.

First of all, since the frequency is automatically tuned using the inputted broadcast channel information, a user needs not to remember the entire frequencies corresponding to a plurality of broadcast channels one by one. Namely, even if the user has no idea of a frequency of a specific broadcast channel, the frequency of the corresponding broadcasting can be conveniently tuned with the broadcast channel information (broadcasting station name, broadcasting program title, anchor, etc.) only.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of tuning a frequency comprising:
   storing broadcast channel information inputted by a user via a first input, the broadcast channel information comprising at least one of a broadcast station name, a broadcast program title or a broadcast anchor;
   storing a frequency inputted by the user via a second input, wherein the frequency is linked to the inputted broadcast channel information;
   receiving the broadcast channel information inputted by the user via a third input;
   searching for a stored frequency linked to the broadcast channel information received via the third input; and
   automatically tuning the searched frequency without a frequency selection input from the user.

2. The method of claim 1, wherein the broadcast channel information comprises at least two of the broadcast station name, the broadcast program title or the anchor.

3. The method of claim 1, wherein the searched frequency is converted to a binary-bit value and wherein tuning the searched frequency comprises using the binary-bit value.

4. The method of claim 1, further comprising indicating the storing of the broadcast channel information and the frequency.

5. The method of claim 2, further comprising storing a channel number linked to the broadcast channel information and frequency.

6. An apparatus for tuning a frequency comprising:
   a first means for receiving broadcast channel information inputted by a user via a first input and a frequency inputted by the user via a second input;
   a second means for storing the received broadcast channel information and the frequency such that they are linked with each other; and
   a third means for searching the second means for a stored frequency linked to the broadcast channel information inputted by the user via a third input to the first means, and for automatically tuning the searched frequency without a frequency selection input from the user.

7. The apparatus of claim 6, wherein the apparatus is incorporated in a communication device.

8. The apparatus of claim 6, wherein the third means is additionally for converting the searched frequency to a binary-bit value and for tuning the frequency using the binary-bit value.

9. The apparatus of claim 8, wherein the third means further comprises:
   an oscillator to output a reference frequency;
   a voltage controlled oscillator adjusted to output an oscillation frequency according to an input voltage;
   a divider to divide an output of the voltage controlled oscillator using the binary-bit value;
   a phase detector to compare outputs of the oscillator and the divider and to output a corresponding difference between the compared outputs; and
   a pulse voltage converter to convert an output of the phase detector to a voltage and to output the voltage to the voltage controlled oscillator.

10. A mobile telecommunication device comprising:
    an input unit to receive broadcast channel information inputted by a user via a first input and a frequency inputted by the user via a second input, the inputted frequency corresponding to the inputted broadcast channel information;
    a memory to store the inputted broadcast channel information and the inputted frequency;
    a display to display an execution process menu;
    a control unit to control the memory to store the inputted broadcast channel information and inputted frequency, to search the memory for a stored frequency corresponding to the broadcast channel information inputted by the user via a third input to the input unit, and to output a control signal to execute the frequency; and a frequency detecting unit to automatically tune the frequency corresponding to the control signal without a frequency selection input from the user.

11. A method of tuning a frequency in a mobile telecommunication device comprising:

storing broadcast channel information inputted by a user via a first input, the broadcast channel information comprising at least one of a broadcast station name, a broadcast program title or a broadcast anchor;

storing a frequency inputted by the user via a second input, wherein the frequency is linked to the inputted broadcast channel information;

displaying a frequency searching menu;

receiving information inputted by the user via a third input;

searching a memory for a frequency corresponding to the information received via the third input; and automatically tuning the frequency linked to the broadcast channel information without a frequency selection input from the user, when the information received via the third input corresponds to the stored broadcast channel information.

12. The method of claim 11, further comprising:

displaying the searched frequency as a numeral and symbol, when the received information has been stored as broadcast channel information.

13. The method of claim 11, further comprising storing a channel number linked to the broadcast channel information and frequency.

* * * * *